(12) United States Patent
Leete

(10) Patent No.: US 7,295,059 B2
(45) Date of Patent: Nov. 13, 2007

(54) SYSTEM AND METHOD FOR COMMON MODE BIAS FOR HIGH FREQUENCY BUFFERS

(75) Inventor: John Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 208 days.

(21) Appl. No.: 10/976,996

(22) Filed: Oct. 29, 2004

(65) Prior Publication Data

US 2006/0091931 A1 May 4, 2006

(51) Int. Cl.
*G06G 7/12* (2006.01)
*G06G 7/26* (2006.01)

(52) U.S. Cl. .................... 327/563; 327/562; 327/108

(58) Field of Classification Search ................ 327/382, 327/560–563, 108; 330/252–253
See application file for complete search history.

(56) References Cited

U.S. PATENT DOCUMENTS

| | | | |
|---|---|---|---|
| 6,021,082 A * | 2/2000 | Shirai ........................ 365/226 |
| 6,281,749 B1 * | 8/2001 | Klayman et al. ........... 330/252 |
| 6,583,661 B1 * | 6/2003 | Tanji et al. ................. 327/355 |
| 6,882,218 B2 * | 4/2005 | Gupta ........................... 330/9 |
| 7,071,779 B2 * | 7/2006 | Shi et al. .................... 330/253 |
| 7,095,272 B2 * | 8/2006 | Morishita ................... 327/541 |
| 2004/0160268 A1 * | 8/2004 | Ozasa et al. ................ 327/543 |
| 2005/0046472 A1 * | 3/2005 | Kim ............................ 327/562 |
| 2005/0073352 A1 * | 4/2005 | Behzad ....................... 327/359 |

* cited by examiner

*Primary Examiner*—Quan Tra
(74) *Attorney, Agent, or Firm*—McAndrews, Held, Malloy, Ltd.

(57) ABSTRACT

Methods and systems for reducing parasitic capacitance of a buffer for an electric circuit are disclosed herein. Aspects of the method may comprise coupling a gate of a first transistor to a first differential input of the buffer and coupling a gate of a second transistor to a second differential input of the buffer. The first and second transistors may be biased by a common mode output of a direct current (DC) voltage source for the buffer, where the common mode output of the DC voltage source may be coupled to the gate of the first transistor and the gate of the second transistor. The first transistor and the second transistor may comprise NMOS transistors and/or PMOS transistors. The DC voltage source may comprise a PMOS transistor and/or an NMOS transistor.

32 Claims, 6 Drawing Sheets

SYSTEM AND METHOD FOR COMMON MODE BIAS FOR HIGH FREQUENCY BUFFERS

RELATED APPLICATIONS

This application is related to the following applications, each of which is incorporated herein by reference in its entirety for all purposes:

U.S. patent application Ser. No. 10/976,976 filed Oct. 29, 2004;
U.S. patent application Ser. No. 10/976,977 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,464 filed Oct. 29, 2004;
U.S. patent application Ser. No. 10/977,798 filed Oct. 29, 2004;
U.S. patent application Ser. No. 10/977,005 filed Oct. 29, 2004;
U.S. patent application Ser. No. 10/977,771 filed Oct. 29, 2004
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004; and
U.S. patent application Ser. No. 10/977,874 filed Oct. 29, 2004.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to the processing of radio signals in a transceiver. More specifically, certain embodiments of the invention relate to a system and method for common mode bias for high frequency buffers.

BACKGROUND OF THE INVENTION

A local oscillator generator (LOGEN) circuit is utilized in a conventional transceiver to generate oscillator reference signals. The oscillator reference signals generated by the LOGEN circuit are utilized by a transmitter and/or a receiver. Since different reference frequencies may be utilized for transmitter and/or receiver operations, multiple local oscillator generators are utilized in conventional transceivers. For example, one or more LOGEN circuits may be utilized by a transmitter block and one or more LOGEN circuits may be utilized by a receiver block within a transceiver. For each LOGEN circuit, a conventional transceiver utilizes one or more calibration circuits that calibrate the LOGEN circuit for a specific frequency or a range of frequencies.

The LOGEN circuits within the transmitter and/or receiver block, however, occupy significant on-chip real estate within a conventional transceiver. In addition, additional on-chip real estate is required for the calibration circuits corresponding to each of the LOGEN circuits utilized within the transceiver. Further, by utilizing several LOGEN circuits, there is an increased possibility of inter-oscillator interference, which causes ineffective oscillator signal generation and decreases efficiency.

LOGEN circuits may be adapted to utilize one or more voltage controlled oscillators (VCOs). The VCOs may be adapted to generate one or more differential frequency outputs and may be followed by one or more divider circuits that divide the generated differential frequency outputs. The VCOs, however, are sensitive to loading from following divider circuits and/or other interconnections. For example, large capacitance and/or resistance created by dividers and line routing limit VCO performance. Conventional LOGEN circuits, therefore, utilize buffers to provide the VCO with a known, reasonable load impedance and enough power to drive any dividers and interconnections with the large signal these devices require to operate correctly. Buffers within conventional LOGEN circuits utilize one or more transistors as transconductors. In addition, resistors are used to isolate buffer inputs and/or outputs, as well as for bias loading circuits within the buffer. Such resistors, however, contribute to the increase of parasitic capacitance and overall excess loading of the buffer outputs.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

Certain embodiments of the invention may be found in a method and system for reducing parasitic capacitance of a buffer for an electric circuit. Aspects of the method may comprise coupling a gate of a first transistor to a first differential input of the buffer and coupling a gate of a second transistor to a second differential input of the buffer. The first and second transistors may be biased by a common mode output of a direct current (DC) voltage source for the buffer. The common mode output of the DC voltage source may be coupled to the gate of the first transistor and the gate of the second transistor. The first transistor and the second transistor may comprise NMOS transistors and/or PMOS transistors. The DC voltage source may comprise a PMOS transistor and/or an NMOS transistor. A first terminal of a first resistor may be coupled to the gate of the first transistor. A second terminal of the first resistor may be coupled to the common mode output of the DC voltage source. A first terminal of a second resistor may be coupled to the gate of the second transistor. A second terminal of the second resistor may be coupled to the common mode output of the DC voltage source. A first terminal of a first inductor may be coupled to a drain of the first transistor. A second terminal of the first inductor may be coupled to the common mode output of the DC voltage source. A first terminal of a second inductor may be coupled to a drain of the second transistor. A second terminal of the second inductor may be coupled to the common mode output of the DC voltage source. The gate of the first transistor may be coupled to a first capacitor and the gate of the second transistor may be coupled to a second capacitor. A source of the first transistor and a source of the second transistor may be coupled to ground.

In an exemplary aspect of the invention, a circuit for reducing parasitic capacitance of a buffer for an electric circuit may comprise a first transistor, where a gate of the first transistor is coupled to a first differential input of the buffer, and a second transistor, where a gate of the second transistor is coupled to a second differential input of the buffer. The circuit may also comprise a direct current (DC) voltage source for the buffer, where the first and second transistors are biased by a common mode output of the DC voltage source, and the common mode output of the DC voltage source is coupled to the gate of the first transistor and the gate of the second transistor.

The first transistor and the second transistor may comprise NMOS and/or PMOS transistors. The DC voltage source may comprise a PMOS and/or and NMOS transistor. A first terminal of a first resistor may be coupled to the gate of the first transistor and a second terminal of the first resistor may be coupled to the common mode output of the DC voltage source. A first terminal of a second resistor may be coupled to the gate of the second transistor and a second terminal of the second resistor may be coupled to the common mode output of the DC voltage source. A first terminal of a first inductor may be coupled to a drain of the first transistor and a second terminal of the first inductor may be coupled to the common mode output of the DC voltage source. A first terminal of a second inductor may be coupled to a drain of the second transistor and a second terminal of the second inductor may be coupled to the common mode output of the DC voltage source. The gate of the first transistor may be coupled to a first capacitor and the gate of the second transistor may be coupled to a second capacitor. A source of the first transistor and a source of the second transistor may be coupled to ground.

These and other features and advantages of the present invention may be appreciated from a review of the following detailed description of the present invention, along with the accompanying figures in which like reference numerals refer to like parts throughout.

DETAILED DESCRIPTION OF THE INVENTION

Certain aspects of the invention may be found in a method and system for reducing parasitic capacitance of a buffer for an electric circuit. A buffer may be utilized to isolate a VCO from one or more divider circuits, for example. A plurality of transistors may be configured within a buffer to operate as transconductors. The transistors may be adapted to receive differential input signals, for example, and generate variable current utilized to generate differential buffer output in a form of variable voltage, for example. A separate DC current source may be utilized within the buffer together with one or more common mode feedback circuits to bias the input transconductors. Isolating resistors utilized in conventional transconductors/transistor common mode feedback biasing circuits may be eliminated altogether and a common mode feedback at the DC current source may be utilized instead. In this manner, parasitic capacitance and buffer loading may be reduced within the buffer circuit.

Figure 1:
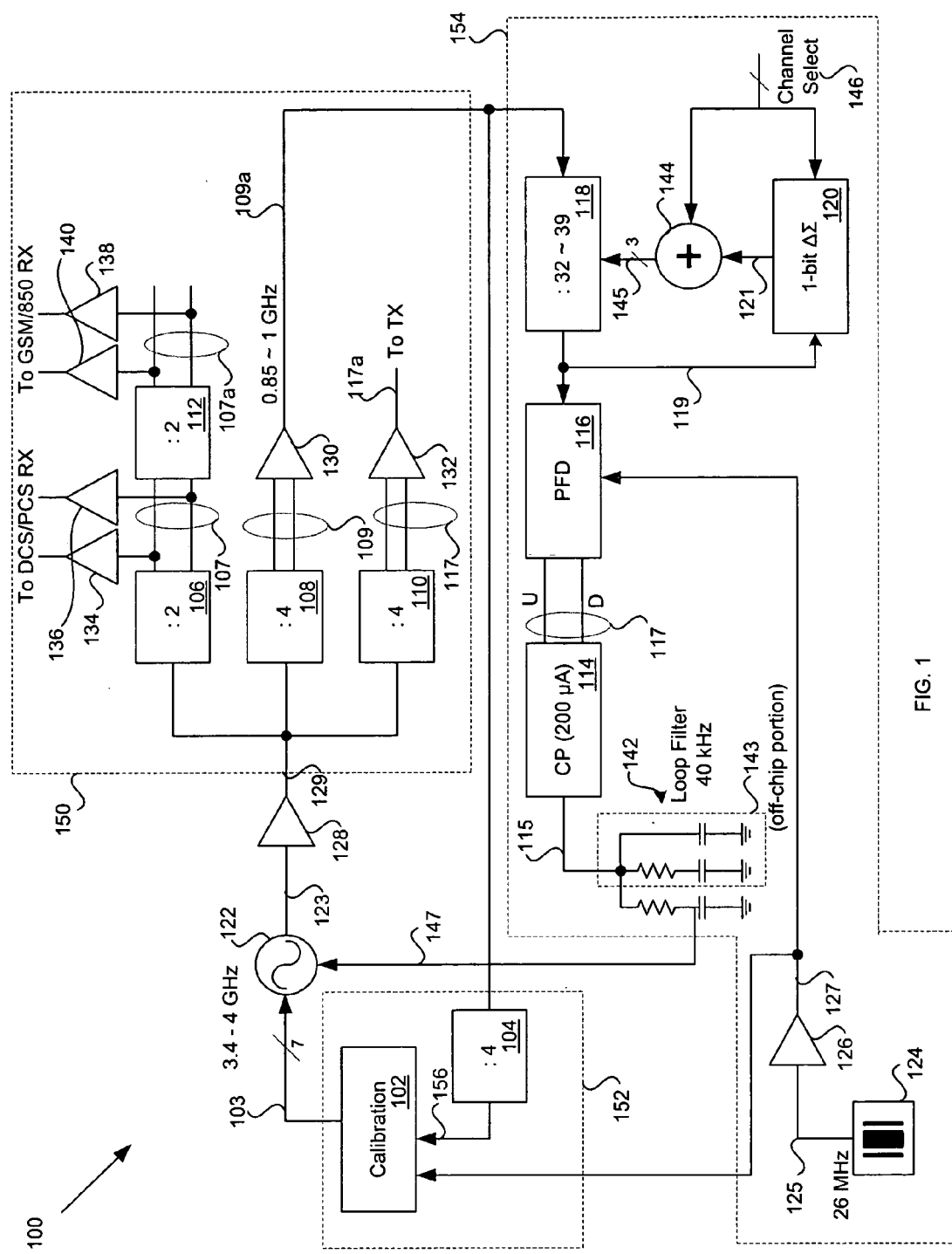
FIG. 1 is a circuit illustrating a synthesizer/local oscillator generator (LOGEN) architecture utilizing fractional-n synthesizer, in accordance with an embodiment of the invention.

FIG. 1 is a circuit illustrating a synthesizer/local oscillator generator (LOGEN) architecture utilizing fractional-n synthesizer, in accordance with an embodiment of the invention. Referring to FIG. 1, the synthesizer/LOGEN architecture 100 may comprise a voltage controlled oscillator (VCO) 122, buffer 128, multiband dividing block 150, coarse calibration circuit 152, and a fine calibration circuit 154.

The multiband dividing block 150 may comprise dividers 106 through 112 and buffers 130 through 140 and may be adapted to receive an oscillator signal 129 from the VCO 122 and generate one or more multiband Rx oscillator signals, such as Rx oscillator signals 107 and 107*a*, a feedback loop reference signal 109*a*, and a Tx oscillator signal 117*a*, for example. The dividers 106 through 112 may comprise suitable circuitry and/or logic and may be adapted to divide an input signal utilizing a determined dividing ratio. The buffers 130 through 140 may comprise suitable circuitry and/or logic and may be adapted to buffer and/or amplify an input signal.

The fine calibration circuit 154 may comprise a multi-modulus divider 118, a delta-sigma modulator 120, a combining block 144, a phase frequency detector 116, a charge pump 114, a loop filter 142, a reference signal oscillator 124, and a buffer 126. The fine calibration circuit 154 may be adapted to receive the feedback loop reference signal 109*a*, the reference oscillator signal 127, and the channel select signal 146, and utilize these received signals to generate a fine calibration signal 147, for example. The multi-modulus divider 118 may comprise suitable circuitry and/or logic and may be adapted to divide the feedback loop reference signal 109*a* utilizing a determined dividing ratio. The dividing ratio utilized by the multi-modulus divider 118 may utilize a fractional-n dividing ratio.

The delta-sigma modulator 120 may comprise suitable circuitry and/or logic and may be adapted to receive a channel select signal 146 and a divided signal 119 and modulate the multi-modulus divider 118 so that a dividing ratio corresponding to the channel select signal 146, and a selected frequency channel information, may be determined for use by the multi-modulus divider 118. In one aspect of the invention, the delta-sigma modulator 120 may generate a 1-bit bitstream signal 121, where the 1-bit bitstream 121 may represent an average level of the input signals to the delta-sigma modulator 120. By generating the 1-bit bitstream 121, the 1-bit delta-sigma modulator 120 may be less sensitive to the charge pump 114 and the nonlinearity of the multi-modulus divider 118, when compared to multi-bit delta-sigma modulators.

The 1-bit bitstream 121, as well as the channel select signal 146, may be communicated to the combining block 144. The combining block 144 may comprise suitable circuitry and/or logic and may be adapted to select either the 1-bit bitstream 121 or the channel select signal 146 for communication to the multi-modulus divider 118. After the combining block 144 selects between the 1-bit bitstream 121 and the channel select signal 146, an output signal 145 may be generated and communicated to the multi-modulus divider 118. The multi-modulus divider 118 may then adjust the dividing ratio, divide the feedback loop reference signal 109a, and generate a divided signal 119. The divided signal 119 may then be communicated to the phase frequency detector 116 as well as to the delta-sigma modulator 120 to be utilized as a feedback signal.

The phase frequency detector 116 may comprise suitable circuitry and/or logic and may be adapted to receive a divided signal 119 and a reference signal 127 and generate an output signal 117 based on the phase difference between the divided signal 119 and the reference signal 127. The output signal 117 may comprise an up (U) component and/or a down (D) component, based on whether the divided signal 119 leads or lags the reference signal 127. The charge pump 114 may comprise suitable circuitry and/or logic and may be adapted to receive the output signal 117 and generate positive or negative charge pulses 115 depending on whether the divided signal 119 leads or lags the reference signal 127.

The charge pulses 115 may then be integrated by the loop filter 142 to generate a fine calibration voltage signal 147. In one aspect of the invention, the loop filter may comprise a 40 kHz filter implemented with a plurality of resistance-capacitance (RC) links connected in parallel. For example, the loop filter 142 may comprise two RC links and a capacitor connected in parallel. The sub-section 143 of the loop filter 142, comprising one RC link and a capacitor, may be implemented off-chip, for example, and the remaining RC link may be implemented on-chip.

The crystal reference signal oscillator 124 may be adapted to generate a reference signal 125. The generated reference signal 125 may be buffered by the buffer 126 and the buffered reference signal 127 may then be communicated to the phase frequency detector 116 and/or to the coarse calibration module 102. In an exemplary aspect of the invention, the reference signal oscillator may generate a reference oscillator signal 125 at 26 MHz. The invention, however, may not be limited by the frequency of the oscillator signal 125 and other reference signals may also be utilized by the fine calibration circuit 154 and/or the coarse calibration circuit 152.

The coarse calibration circuit 152 may comprise a divider 104 and a coarse calibration module 102. The coarse calibration circuit 152 may be adapted to receive the feedback loop reference signal 109a and the reference oscillator signal 127 to generate, for example, a 7-bit coarse calibration signal 103. The coarse calibration signal 103 and the fine calibration signal 147 may be utilized by the VCO 122 for coarse and fine calibration of the generated oscillator signal 123 in accordance with the selected channel as determined by the channel select signal 146. The divider 104 may comprise suitable circuitry and/or logic and may be adapted to divide an input signal utilizing a determined dividing ratio. For example, the divider 104 may comprise a divide by four (4) dividing circuit and may be adapted to receive the feedback loop reference signal 109a and generate a divided signal 156. Although a 7-bit coarse calibration is utilized, the invention is not so limited. Coarse calibration utilizing a different number of bits may also be utilized.

The coarse calibration module 102 may comprise suitable circuitry and/or logic and may be adapted to receive the reference signal 127 and the divided signal 156 to generate a coarse calibration signal 103. In one aspect of the invention, the coarse calibration module 102 may utilize 7-bit coarse calibration signal generation techniques. For example, a 7-bit coarse calibration signal 103 may be selected from 128 different frequencies. The coarse calibration module 102 may be adapted to select a calibration signal that is close to one of the 128 reference frequencies. By utilizing 7-bit coarse calibration techniques, the coarse calibration module 102 may be adapted to quickly generate the coarse calibration signal 103. The coarse calibration signal 103 may then be communicated to the VCO 122 for coarse calibration followed by a fine calibration utilizing the fine calibration signal 147.

In operation, the VCO 122 may generate an oscillator signal 123. The oscillator signal 123 may be generated within a determined range, such as between about 3.4 GHz and 4 GHz, in accordance with a channel select signal 146. The channel select signal 146 may be a user-generated signal and may correspond to a selected channel associated with a frequency band, such as DCS, PCS, and/or GSM, for example. After the VCO 122 generates the oscillator signal 123, the oscillator signal 123 may be buffered by the buffer 128. The buffered oscillator signal 129 may then be communicated to the multiband dividing block 150 for further processing.

In one aspect of the invention, the multiband dividing block 150 may utilize divide by two (2) dividing circuits 106 and 112 to divide the oscillator signal 129 and generate multiband Rx oscillator signals 107 and 107a. For example, the divide by two (2) dividing circuit 106 may divide the oscillator signal 129 to generate the in-phase (I) and quadrature (Q) components of the multiband Rx oscillator signal 107. The in-phase (I) and quadrature (Q) components of the multiband Rx oscillator signal 107 may then be buffered by the buffers 134 and 136, respectively. The multiband Rx oscillator signal 107 may be between about 1.7 GHz and 1.9 GHz, for example, for Rx oscillator signal coverage in the DCS and PCS bands.

The multiband Rx oscillator signal 107 may then be further divided by the divide by two (2) dividing circuit 112 to generate the in-phase (I) and quadrature (Q) components of the multiband Rx oscillator signal 107a. The in-phase (I) and quadrature (Q) components of the multiband Rx oscillator signal 107a may then be buffered by the buffers 140 and 138, respectively. The multiband Rx oscillator signal 107a may be between about 850 MHz and 900 MHz, for example, for Rx oscillator signal coverage in the GSM band and the 850 MHz band.

In another aspect of the invention, the oscillator signal 129 may be utilized by the multiband dividing block 150 to generate the feedback loop reference signal 109a. For example, the oscillator signal 129 may be divided by the divide by four (4) dividing circuit 108 to generate the in-phase (I) and quadrature (Q) components of the feedback loop reference signal 109. The generated feedback reference signal 109 may then be buffered by the buffer 130 and the buffered feedback loop reference signal 109a may be communicated to the fine calibration circuit 154 and/or the coarse calibration circuit 152. The feedback loop reference signal 109a may be between about 850 MHz and 1 GHz, for example, and may be utilized for the generation of the coarse calibration and fine calibration signals 103 and 147, respectively. The present invention may not be limited by the frequency range of the VCO generated oscillator signal 123 and the feedback loop reference signal 109a. Therefore, frequency ranges other than a VCO generated oscillator frequency range of about 3.4 GHz to 4 GHz may also be utilized within the synthesizer/LOGEN architecture 100.

The oscillator signal 129 may also be utilized by the multiband dividing block 150 to generate the Tx oscillator signal 117a. For example, the oscillator signal 129 may be divided by the divide by four (4) dividing circuit 110 to generate the in-phase (I) and quadrature (Q) components of the Tx oscillator signal 117. The Tx oscillator signal 117 may then be buffered by the buffer 132 and the buffered Tx oscillator signal 117a may be communicated to a transmitter block, for example, for further processing.

After the feedback loop reference signal is generated by the multiband dividing block 150, the feedback loop reference signal may be communicated to the fine calibration circuit 154 and the coarse calibration circuit 152. In one aspect of the invention, the fine calibration circuit 154 may comprise a fractional-n synthesizer adapted to generate the fine calibration signal 147. The multi-modulus divider 118 may receive and divide the feedback loop reference signal 109a utilizing a determined dividing ratio. The dividing ratio utilized by the multi-modulus divider 118 may comprise a fractional-n dividing ratio. For example, if the feedback loop reference signal is between about 850 MHz and 1 GHz, the multi-modulus divider 118 may utilize a fractional dividing ratio of about 32.0 to 39.0. In this manner, the divided signal 119 may be about 25-26 MHz, which signal may then be compared with the reference oscillator signal 127 in the phase frequency detector 116.

The delta-sigma modulator 120 may receive a channel select signal 146 and a divided signal 119 and modulate the multi-modulus divider 118 so that a dividing ratio corresponding to the channel select signal 146, and a selected frequency channel information, may be determined for use by the multi-modulus divider 118. The delta-sigma modulator 120 may be adapted to generate, for example, a 1-bit bitstream signal 121, for example, where the 1-bit bitstream 121 may represent an average level of the input signals to the delta-sigma modulator 120.

The 1-bit bitstream 121, as well as the channel select signal 146, may be communicated to the combining block 144. The combining block 144 may select either the 1-bit bitstream 121 or the channel select signal 146 for communication to the multi-modulus divider 118. After the combining block 144 selects between the 1-bit bitstream 121 and the channel select signal 146, an output signal 145 may be generated and communicated to the multi-modulus divider 118. The multi-modulus divider 118 may then adjust the dividing ratio, divide the feedback loop reference signal 109a, and generate a divided signal 119. The divided signal 119 may then be communicated to the phase frequency detector 116 as well as to the delta-sigma modulator 120.

The phase frequency detector 116 may receive the divided signal 119 and a reference signal 127 from the reference oscillator 124, and generate an output signal 117 based on the phase difference between the divided signal 119 and the reference signal 127. The output signal 117 may comprise an up (U) component and/or a down (D) component, based on whether the divided signal 119 leads or lags the reference signal 127. The charge pump 114 may be adapted to receive the output signal 117 and generate positive or negative charge pulses 115 depending on whether the divided signal 119 leads or lags the reference signal 127. The charge pulses 115 may then be integrated by the loop filter 142 to generate a fine calibration signal 147. After the fine calibration signal 147 is generated by the loop filter 142, the fine calibration signal 147 may be communicated to the VCO 122 for fine calibration.

After the feedback loop reference signal 109a is generated by the multiband dividing block 150, the feedback loop reference signal 109a may also be communicated to the coarse calibration circuit 152 for further processing. The coarse calibration circuit 152 may be adapted to receive the feedback loop reference signal 109a and the reference oscillator signal 127 to generate a 7-bit coarse calibration signal 103. The coarse calibration signal 103 and the fine calibration signal 147 may be utilized by the VCO 122 for coarse and fine calibration of the generated oscillator signal 123 in accordance with the selected channel as determined by the channel select signal 146.

The feedback loop reference signal 109a may be initially communicated to the divider 104. The divider 104 may divide the feedback loop reference signal 109a and generate a divided signal 156. The coarse calibration module 102 may receive the reference signal 127 and the divided signal 156 to generate a coarse calibration signal 103. In one aspect of the invention, the coarse calibration module 102 may utilize 7-bit coarse calibration signal generation techniques. For example, a 7-bit coarse calibration signal 103 may be selected from 128 different frequencies. The coarse calibration module 102 may be adapted to select a calibration signal that is close to one of the 128 reference frequencies. The coarse calibration signal 103 may then be communicated to the VCO 122 for coarse calibration followed by a fine calibration utilizing the fine calibration signal 147.

In one aspect of the invention, buffers 128 through 140 within the synthesizer/LOGEN architecture 100 may be implemented as high frequency buffers. In addition, buffers 128 through 140 may utilize PMOS and/or NMOS transistors as transconductors with a common mode bias from a DC current source within the buffers. In this manner, parasitic capacitance with buffers 128 through 140, as well as within the synthesizer/LOGEN architecture 100, may be reduced.

Figure 2:
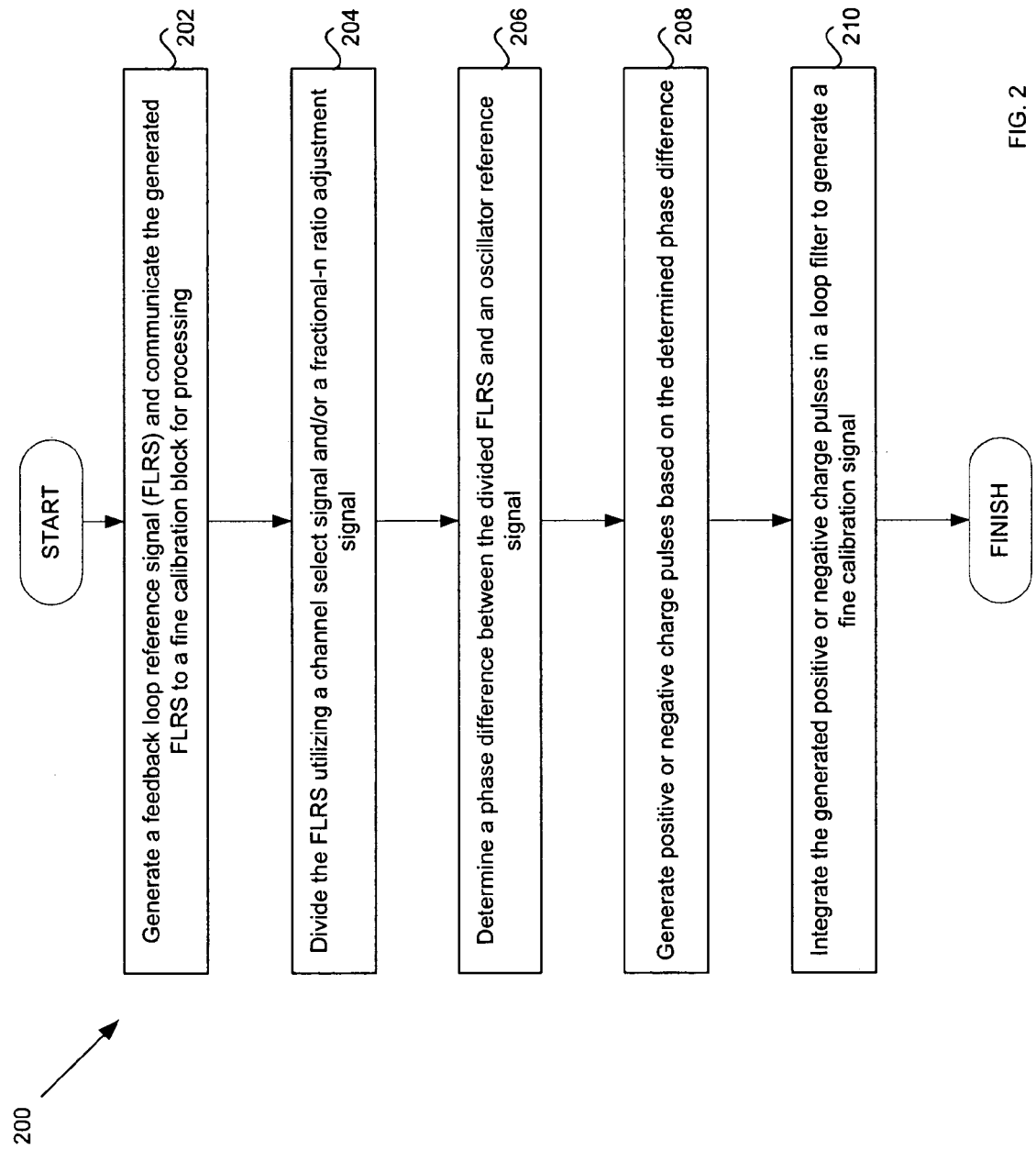
FIG. 2 is a flow diagram of an exemplary method for generating a fine calibration signal, in accordance with an embodiment of the invention.

FIG. 2 is a flow diagram of an exemplary method 200 for generating a fine calibration signal, in accordance with an embodiment of the invention. Referring to FIG. 2, at 202, a feedback loop reference signal may be generated and communicated to a fine calibration block for processing. At 204, the feedback loop reference signal may be divided by a fractional-n divider. The fractional-n divider may utilize a channel select input signal and/or a fractional-n dividing ratio adjustment signal to divide the feedback loop reference signal. At 206, a phase difference may be determined between the divided feedback loop reference signal and an oscillator reference signal. At 208, positive or negative charges may be generated based on the determined phase difference between the divided feedback loop reference signal and an oscillator reference signal. For example, positive or negative charges may be generated by a charge pump. At 210, the generated positive or negative charges may be integrated in a loop filter to generate a fine calibration signal.

Figure 3:
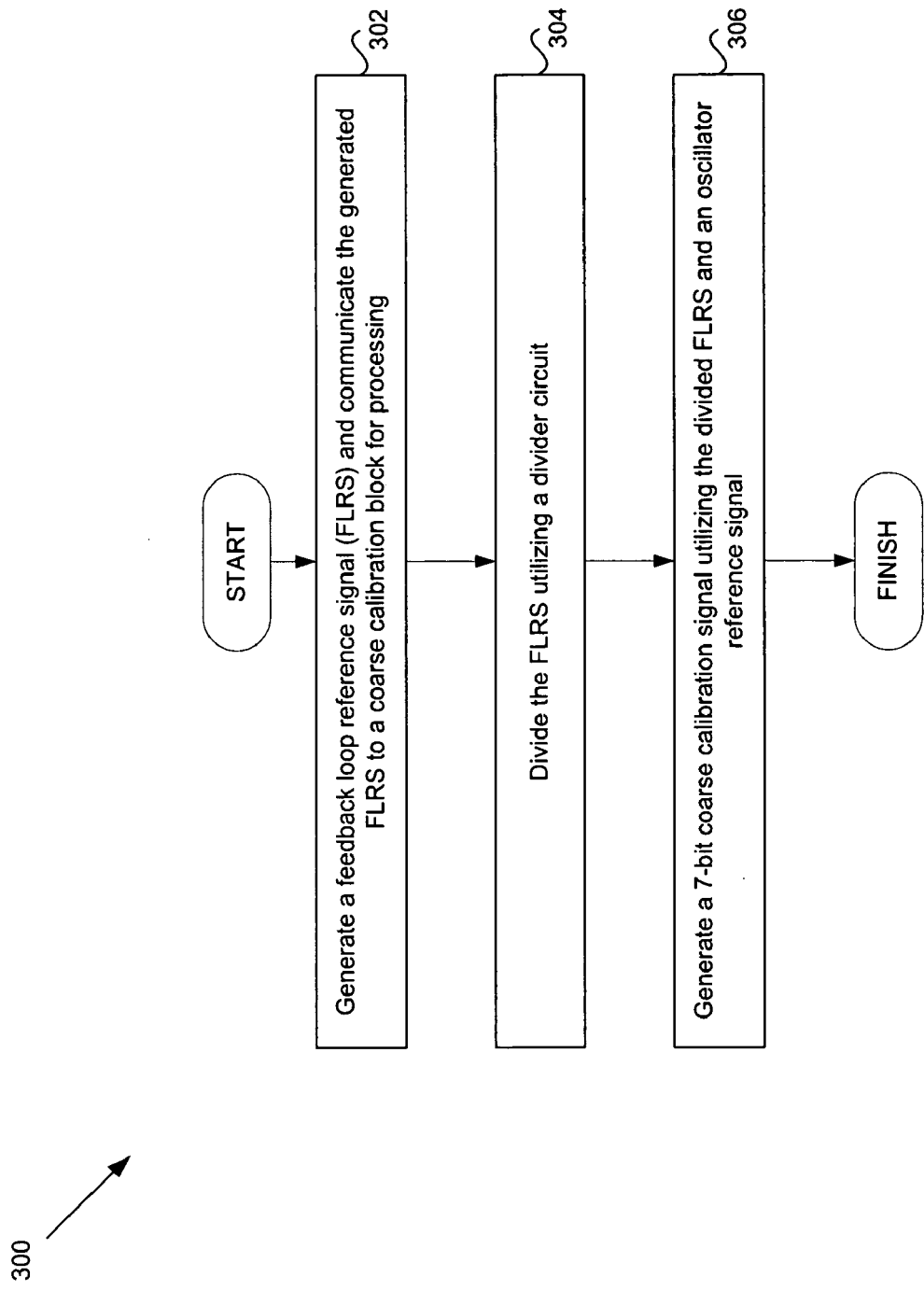
FIG. 3 is a flow diagram of an exemplary method for generating a coarse calibration signal, in accordance with an embodiment of the invention.

FIG. 3 is a flow diagram of an exemplary method 300 for generating a coarse calibration signal, in accordance with an embodiment of the invention. Referring to FIG. 3, at 302, a feedback loop reference signal may be generated and communicated to a coarse calibration block for processing. At 304, the generated feedback loop reference signal may be divided utilizing a divider circuit. At 306, a 7-bit coarse calibration signal utilizing the divided feedback loop reference signal and an oscillator reference signal.

Figure 4:
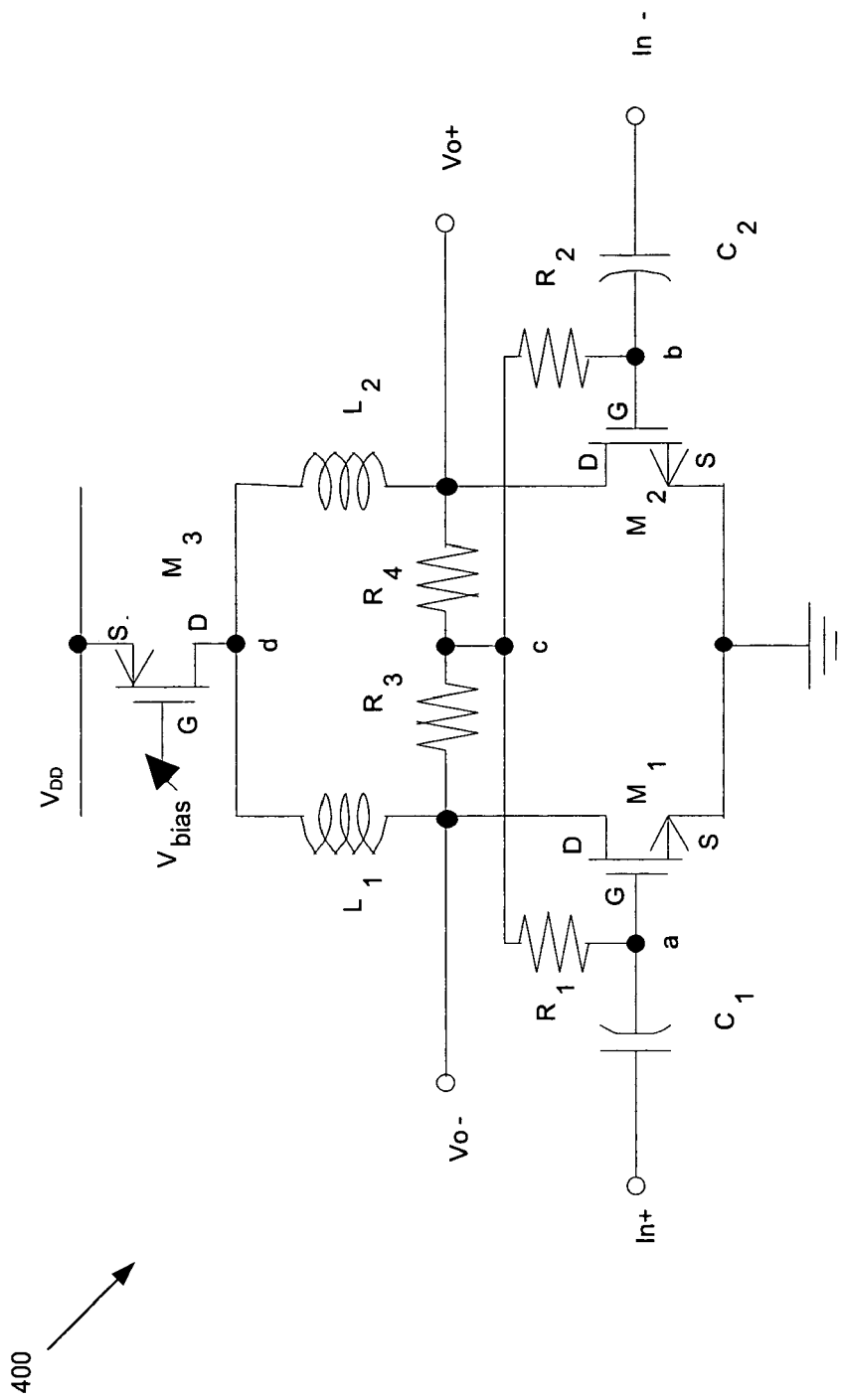
FIG. 4 is a circuit illustrating a buffer with PMOS current bias that may be utilized in accordance with an embodiment of the invention.

FIG. 4 is a circuit illustrating a buffer 400 with PMOS current bias that may be utilized in accordance with an embodiment of the invention. Referring to FIG. 4, the buffer 400 may comprise transistors M1 through M3, resistors R1 through R4, inductors L1 and L2, and capacitors C1 and C2. The buffer 400 may also comprise differential inputs In+ and In− and corresponding differential outputs Vo− and Vo+.

In one aspect of the invention, transistor M3 may comprise a PMOS transistor and transistors M2 and M1 may comprise NMOS transistors. Transistor M3 may be implemented as a DC current source by connecting the source of M3 to a DC voltage source $V_{DD}$. The DC current source transistor may be turned on and off by changing the gate voltage $V_{bias}$. The drain of M3 may be coupled to node "d" of the buffer 400 so that DC current may flow down to transistors M1 and M2.

Transistors M1 and M2 may be implemented as transconductors utilizing NMOS transistors, for example. The gates of transistors M1 and M2 may be AC coupled by the capacitors C1 and C2, respectively. By utilizing capacitors C1 and C2 after the differential inputs In+ and In−, direct current may not be conducted to the gates of transistors M1 and M2 and only AC signal may be allowed to pass through capacitors C1 and C2. In this matter, AC signal from the inputs In+ and In− may pass through C1 and C2 and be preserved at nodes "a" and "b." The sources of transistors M1 and M2 may be connected to ground and the drains of transistors M1 and M2 may be connected to inductors L1 and L2 respectively.

Inductors L1 and L2 may be utilized to allow any direct current coming from the DC current source transistor M3 and block any alternating current coming from the drains of transistors M1 and M2. Resistors R1 and R2 may be utilized to isolate the differential inputs In+ and In−, and resistors R3 and R4 may be utilized to isolate the differential outputs Vo− and Vo+. Resistors R1 and R2 may be utilized to isolate nodes "a," "b," and "c" from each other so that AC signals passing through capacitors C1 and C2 may not be lost to node "c" but may instead be preserved at nodes "a" and "b" to generate the maximum AC current possible by M1 and M2.

Since transistors M1 and M2 may be implemented as transconductors, or voltage-to-current generators, as AC charge accumulates at the gates of transistors M1 and M2, corresponding transistor current may also change proportionately. In order for transistors M1 and M2 to operate as transconductors, M1 and M2 may need to operate in their saturation region. The DC current source transistor M3 may also need to be saturated in order to operate as a current source. In this manner, transistors M1, M2, and M3 may be turned ON within the buffer 400 by adjusting their respective gate-source voltages $V_{GS}$ to be greater than a threshold voltage $V_{THR}$, or $V_{GS} > V_{THR}$. After transistors M1, M2, and M3 are turned ON by adjusting their gate-source voltages $V_{GS}$ to be greater than a threshold voltage $V_{THR}$, transistors M1 through M3 may operate saturated by adjusting their drain to source voltages $V_{DS}$ to be greater than a saturation voltage $V_{DSAT}$.

In an exemplary aspect of the invention, transistors M1 and M2 may be biased utilizing common mode feedback by averaging the outputs Vo− and Vo+ via a mid-point between resistors R3 and R4, for example. Since the outputs Vo− and Vo+ of buffer 400 are differential, AC signals at the outputs Vo− and Vo+ may cancel each other out at node "c." Accordingly, a DC average signal may remain at node "c" and may be utilized for common mode feedback through resistors R1 and R2 to the gates of transistors M1 and M2, respectively. In this manner, AC signal from the differential inputs In+ and In− may pass through capacitors C1 and C2 and may be combined at nodes "a" and "b" with the DC biasing voltage from node "c."

In operation, DC voltage from the differential inputs of buffer 400 may be blocked by capacitors C1 and C2, and AC voltage may pass through and accumulate at nodes "a" and "b" and "ride on top of" DC bias voltage from node "c." As the input AC voltage passing through capacitors C1 and C2 changes, the gate-to-source voltage $V_{GS}$ of transistors M1 and M2 may also change accordingly. As a result of changes in $V_{GS}$, AC current may be generated by transistors M1 and M2. Inductors L1 and L2 may be adapted to respond to the AC current generated by transistors M1 and M2 with a sufficiently large impedance, thus blocking any AC current from reaching the DC current at node "d." As a result of the AC current generated by transistors M1 and M2 and the corresponding impedance of L1 and L2, output AC voltages may be generated and communicated outside the buffer 400 via differential outputs Vo− and Vo+.

In a different aspect of the invention, parasitic capacitance and resulting load on buffer 400 may be reduced by eliminating resistors R3 and R4. The common mode DC biasing for transistors M1 and M2 may then be utilized from node "d" of the DC current source transistor M3. By eliminating R3 and R4, the buffer 400 may be implemented utilizing smaller area in silicon.

Figure 5:
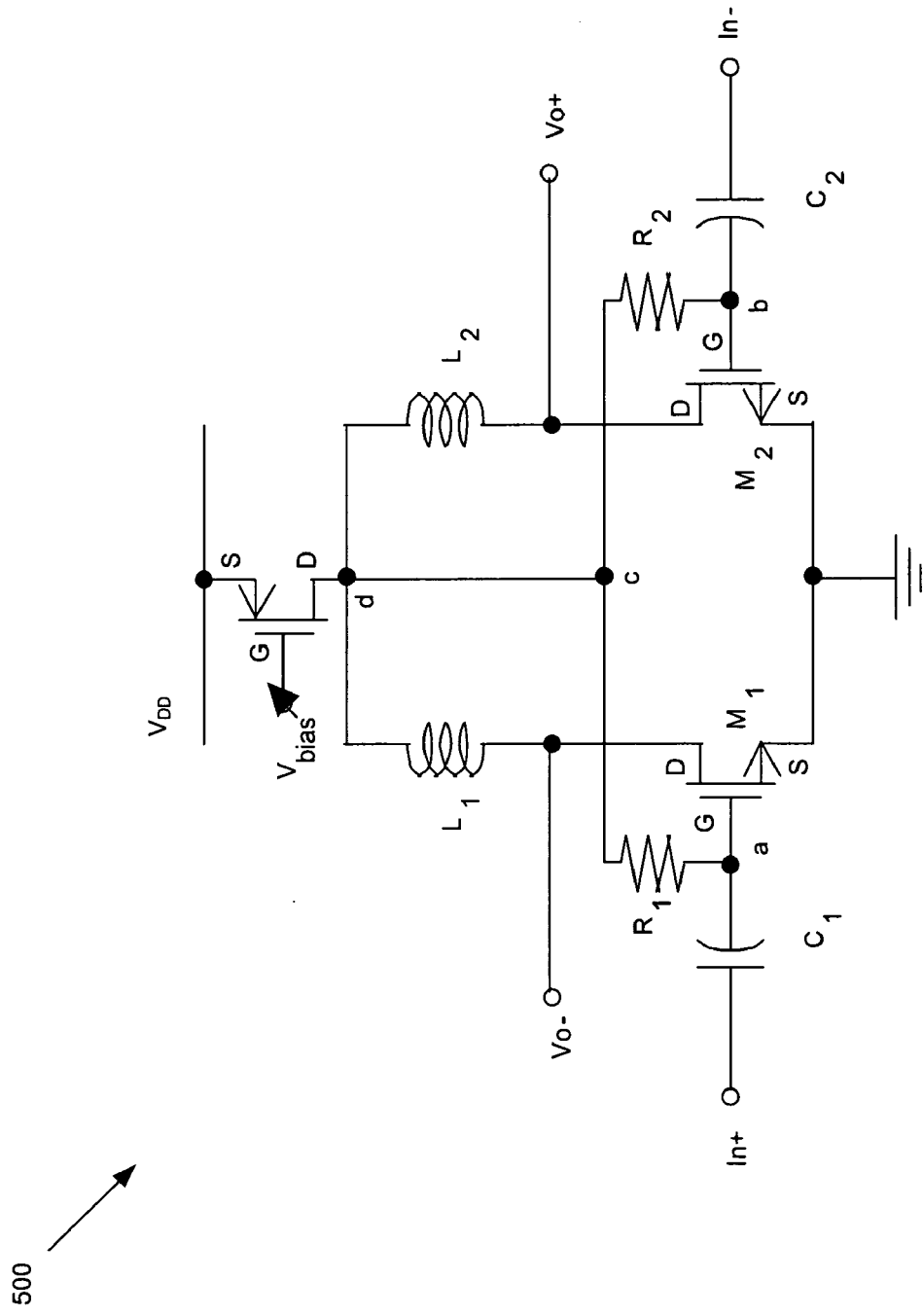
FIG. 5 is a circuit illustrating a buffer with a PMOS current source and common mode bias, in accordance with an embodiment of the invention.

FIG. 5 is a circuit illustrating a buffer 500 with a PMOS current source and common mode bias, in accordance with an embodiment of the invention. Referring to FIG. 5, the buffer 500 may comprise transistors M1 through M3, resistors R1 and R2, inductors L1 and L2, and capacitors C1 and C2. The buffer 500 may also comprise differential inputs In+ and In− and corresponding differential outputs Vo− and Vo+.

In one aspect of the invention, transistor M3 may comprise a PMOS transistor and transistors M2 and M1 may comprise NMOS transistors. Transistor M3 may be implemented as a DC current source by connecting the source of M3 to a DC voltage source $V_{DD}$. The DC current source transistor may be turned on and off by changing the gate voltage $V_{bias}$. The drain of M3 may be coupled to node "d" of the buffer 500 so that DC current may flow down to transistors M1 and M2.

Transistors M1 and M2 may be implemented as transconductors utilizing NMOS transistors, for example. The gates of transistors M1 and M2 may be AC coupled by the capacitors C1 and C2, respectively. By utilizing capacitors C1 and C2 after the differential inputs In+ and In−, direct current (DC) may not be conducted to the gates of transistors M1 and M2 and only alternating current (AC) may be allowed to pass through capacitors C1 and C2. In this manner, AC signal from the inputs In+ and In− may pass through capacitors C1 and C2 and arrive at the gates of transistors M1 and M2. The sources of transistors M1 and M2 may be connected to ground and the drains of transistors M1 and M2 may be connected to inductors L1 and L2 respectively.

Inductors L1 and L2 may be utilized to allow any direct current coming from the DC current source transistor M3 and block any alternating current coming from the drains of transistors M1 and M2. Resistors R1 and R2 may be utilized to isolate the differential inputs In+ and In−, for example. Resistors R1 and R2 may also be utilized to isolate nodes "a," "b," and "c" from each other so that AC signals passing through capacitors C1 and C2 may not reach node "c" and may instead accumulate at nodes "a" and "b" to build the required AC charge necessary for the AC current generation by M1 and M2.

Since transistors M1 and M2 may be implemented as transconductors, or voltage-to-current generators, as AC charge accumulates at the gates of transistors M1 and M2, corresponding transistor current may also change proportionately. In order for transistors M1 and M2 to operate as transconductors, M1 and M2 may need to operate in their saturation region. The DC current source transistor M3 may also need to be saturated in order to operate as a current source. In this manner, transistors M1, M2, and M3 may be turned ON within the buffer 500 by adjusting their respective gate-source voltages $V_{GS}$ to be greater than a threshold voltage $V_{THR}$, or $V_{GS} > V_{THR}$. After transistors M1, M2, and M3 are turned ON by adjusting their gate-source voltages $V_{GS}$ to be greater than a threshold voltage $V_{THR}$, transistors M1 through M3 may operate in saturation by adjusting their drain to source voltages $V_{DS}$ to be greater than their respective saturation voltages $V_{DSAT}$.

In an exemplary aspect of the invention, transistors M1 and M2 may be biased utilizing common mode feedback by averaging the outputs Vo− and Vo+ via a mid-point between the inductors L1 and L2, at node "d." Since the outputs Vo− and Vo+ of buffer 500 are differential, AC signals at the outputs Vo− and Vo+ may be blocked by the impedance of inductors L1 and L2, thus not reaching node "d." As inductors L1 and L2 may conduct the DC current from the differential outputs Vo− and Vo+, DC common mode bias may be acquired from node "d" and communicated through node "c" to nodes "a" and "b" of transistors M1 and M2. Accordingly, a DC average signal may remain at node "d" and may be utilized for common mode feedback through resistors R1 and R2 to the gates of transistors M1 and M2, respectively. In this manner, AC signal from the differential inputs In+ and In− may pass through capacitors C1 and C2 and may be combined at nodes "a" and "b" with the DC biasing voltage from node "c." By utilizing common mode DC bias from node "d" and eliminating a common mode resistor pair coupled to differential outputs Vo− and Vo+, as illustrated in FIG. 4, parasitic capacitance and loading of buffer 500 may be reduced.

In operation, DC voltage from the differential inputs of buffer 500 may be blocked by capacitors C1 and C2, and AC signal from the differential inputs In+ and In− may pass through capacitors C1 and C2 and may be combined at nodes "a" and "b" with the DC biasing voltage from node "c." As the input AC voltage passing through capacitors C1 and C2 changes, the gate-to-source voltage $V_{GS}$ of transistors M1 and M2 may also change accordingly. As a result of changes in $V_{GS}$, AC current may be generated by transistors M1 and M2. Inductors L1 and L2 may be adapted to respond to the AC current generated by transistors M1 and M2 with a sufficiently large impedance, thus blocking any AC current from reaching the DC current at node "d." As a result of the AC current generated by transistors M1 and M2 and the corresponding impedance of L1 and L2, output AC voltages may be generated and communicated outside the buffer 500 via differential outputs Vo− and Vo+.

Even though aspects of the present invention may utilize a PMOS transistor as a DC current source and NMOS transistors as differential buffer input transconductors, the invention may not be so limited. Accordingly, an NMOS transistor may be utilized as a DC current source and PMOS transistors may be utilized as differential buffer input transconductors.

Figure 6:
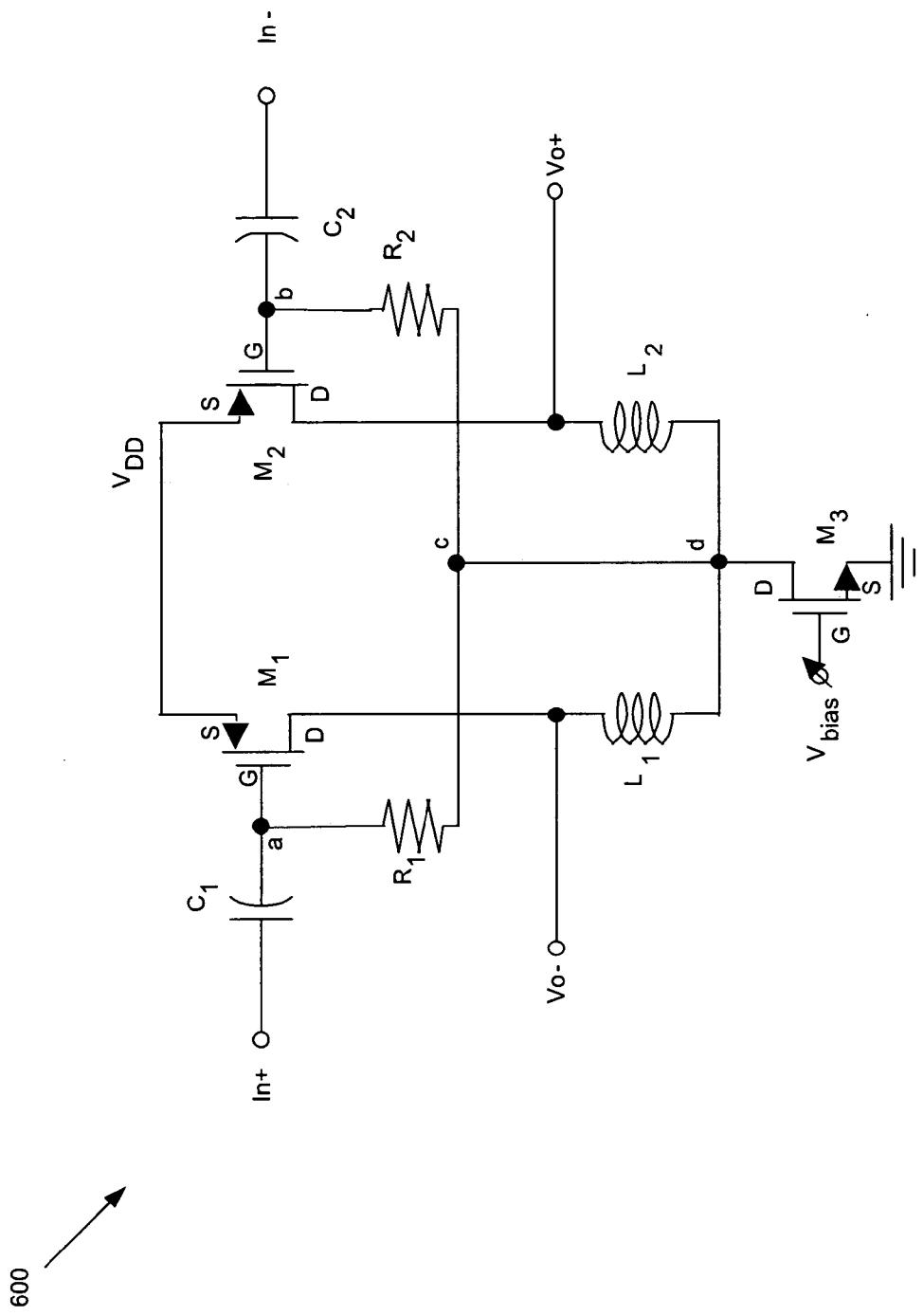
FIG. 6 is a circuit illustrating a buffer with an NMOS current source and common mode bias, in accordance with an embodiment of the invention.

FIG. 6 is a circuit illustrating a buffer 600 with an NMOS current source and common mode bias, in accordance with an embodiment of the invention. Referring to FIG. 6, the buffer 600 may comprise transistors M1 through M3, resistors R1 and R2, inductors L1 and L2, and capacitors C1 and C2. The buffer 600 may also comprise differential inputs In+ and In− and corresponding differential outputs Vo− and Vo+.

In one aspect of the invention, transistor M3 may comprise an NMOS transistor and transistors M2 and M1 may comprise PMOS transistors. Transistor M3 may be implemented as a DC current source by connecting the source of M3 to ground and the drain to node "d," which may be connected to a DC voltage source $V_{DD}$ via the sources of transistors M1 and M2. The DC current source transistor may be turned on and off by changing the gate voltage $V_{bias}$. The drain of M3 may be coupled to node "d" of the buffer 500 so that DC current may flow to transistors M1 and M2.

Transistors M1 and M2 may be implemented as transconductors utilizing PMOS transistors, for example. The gates of transistors M1 and M2 may be AC coupled by the capacitors C1 and C2, respectively. By utilizing capacitors C1 and C2 after the differential inputs In+ and In−, direct current (DC) may not be conducted to the gates of transistors M1 and M2 and only alternating current (AC) may be allowed to pass through capacitors C1 and C2. In this manner, AC charge from the inputs In+ and In− may induce charge on the opposite sides of capacitors C1 and C2 that accumulates at the gates of transistors M1 and M2. The sources of transistors M1 and M2 may be connected to the DC voltage source $V_{DD}$.

Inductors L1 and L2 may be utilized to allow any direct current (DC) coming from the DC current source transistor M3 and block any alternating current coming from the drains of transistors M1 and M2. Resistors R1 and R2 may be utilized to isolate the differential inputs In+ and In−, for example. Resistors R1 and R2 may also be utilized to isolate nodes "a," "b," and "c" from each other so that AC signals passing through capacitors C1 and C2 may not reach node "c." Accordingly, the AC signals may induce charge on the opposite sides of capacitors C1 and C2 and may accumulate at nodes "a" and "b" to build the required AC charge necessary for the AC current generation by M1 and M2.

Since transistors M1 and M2 may be implemented as transconductors, or voltage-to-current converters as AC charge accumulates at the gates of transistors M1 and M2, corresponding transistor current may also change proportionately. In order for transistors M1 and M2 to operate as transconductors, M1 and M2 may need to operate in their saturation region. The DC current source transistor M3 may also need to be saturated in order to operate as a current source. In this manner, transistors M1, M2, and M3 may be turned ON within the buffer 600 by adjusting their respective gate-source voltages $V_{GS}$ to be greater than a threshold voltage $V_{THR}$, or $V_{GS} > V_{THR}$. After transistors M1, M2, and M3 are turned ON by adjusting their gate-source voltages $V_{GS}$ to be greater than a threshold voltage $V_{THR}$, transistors M1 through M3 may operate saturated by adjusting their drain to source voltages $V_{DS}$ to be greater than their respective saturation voltages $V_{DSAT}$.

In an exemplary aspect of the invention, transistors M1 and M2 may be biased utilizing common mode feedback by averaging the outputs Vo− and Vo+ via a mid-point between the inductors L1 and L2, at node "d." Since the outputs Vo− and Vo+ of buffer 600 are differential, AC signals at the outputs Vo− and Vo+ may cancel out at node "d." Furthermore, the impedance of inductors L1 and L2 may resist the transfer of odd order harmonics, which may not cancel out in a differential system, to node "d." This As inductors L1 and L2 may conduct the DC current from the differential outputs Vo− and Vo+, DC common mode bias may be acquired from node "d" and communicated through node "c" to nodes "a" and "b" of transistors M1 and M2. Accordingly, a DC average signal may remain at node "d" and may be utilized for common mode feedback through resistors R1 and R2 to the gates of transistors M1 and M2, respectively. AC signal from the differential inputs In+ and In− may pass through capacitors C1 and C2 and may be combined at nodes "a" and "b" with the DC biasing voltage from node "c." By utilizing common mode DC bias from node "d" and eliminating a common mode resistor pair coupled to differential outputs Vo− and Vo+, as illustrated in FIG. 4, parasitic capacitance and loading of buffer 600 may be reduced.

In operation, DC voltage from the differential inputs of buffer 600 may be blocked by capacitors C1 and C2. AC signal from the differential inputs In+ and In− may pass through capacitors C1 and C2 and may be combined at nodes "a" and "b" with the DC biasing voltage from node "c." As the input AC signal passing through capacitors C1 and C2 changes, the gate-to-source voltage $V_{GS}$ of transistors M1 and M2 may also change accordingly. As a result of changes in $V_{GS}$, AC current may be generated by transistors M1 and M2. Inductors L1 and L2 may be adapted to respond to the AC current generated by transistors M1 and M2 with a sufficiently large impedance, thus blocking any AC current from reaching the DC current at node "d." As a result of the AC current generated by transistors M1 and M2 and the corresponding impedance of L1 and L2, output AC voltages may be generated and communicated outside the buffer 600 via differential outputs Vo− and Vo+.

Accordingly, aspects of the invention may be realized in hardware, software, firmware or a combination thereof. The invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for reducing parasitic capacitance of a buffer for an electric circuit, the method comprising:
   coupling a gate of a first transistor to a first differential input of the buffer via a first capacitor;
   coupling a gate of a second transistor to a second differential input of the buffer via a second capacitor; and
   biasing said first and second transistors by a common mode output of a direct current (DC) voltage source for the buffer, wherein said common mode output of said DC voltage source is directly coupled to at least one differential output of the buffer via a single resistor.

2. The method according to claim 1, wherein said first transistor and said second transistor comprise NMOS transistors.

3. The method according to claim 1, wherein said first transistor and said second transistor comprise PMOS transistors.

4. The method according to claim 1, wherein said DC voltage source comprises a PMOS transistor.

5. The method according to claim 1, wherein said DC voltage source comprises an NMOS transistor.

6. The method according to claim 1, comprising coupling a first terminal of a first resistor to said gate of said first transistor.

7. The method according to claim 6, comprising coupling a second terminal of said first resistor to said common mode output of said DC voltage source.

8. The method according to claim 1, comprising coupling a first terminal of a second resistor to said gate of said second transistor.

9. The method according to claim 8, comprising coupling a second terminal of said second resistor to said common mode output of said DC voltage source.

10. The method according to claim 1, comprising coupling a first terminal of a first inductor to a drain of said first transistor.

11. The method according to claim 10, comprising coupling a second terminal of said first inductor to said common mode output of said DC voltage source.

12. The method according to claim 1, comprising coupling a first terminal of a second inductor to a drain of said second transistor.

13. The method according to claim 12, comprising coupling a second terminal of said second inductor to said common mode output of said DC voltage source.

14. The method according to claim 1, comprising coupling said gate of said first transistor to a first capacitor.

15. The method according to claim 1, comprising coupling said gate of said second transistor to a second capacitor.

16. The method according to claim 1, comprising coupling a source of said first transistor and a source of said second transistor to ground.

17. A circuit for reducing parasitic capacitance of a buffer for an electric circuit, the circuit comprising:
   a first transistor, wherein a gate of said first transistor is coupled to a first differential input of the buffer via a first capacitor;
   a second transistor, wherein a gate of said second transistor is coupled to a second differential input of the buffer via a second capacitor; and
   a direct current (DC) voltage source, wherein said first and second transistors are biased by a common mode output of said DC voltage source, and said common mode output of said DC voltage source is directly coupled to at least one differential output of the buffer via a single resistor.

18. The circuit according to claim 17, wherein said first transistor and said second transistor comprise NMOS transistors.

19. The circuit according to claim 17, wherein said first transistor and said second transistor comprise PMOS transistors.

20. The circuit according to claim 17, wherein said DC voltage source comprises a PMOS transistor.

21. The circuit according to claim 17, wherein said DC voltage source comprises an NMOS transistor.

22. The circuit according to claim 17, wherein a first terminal of a first resistor is coupled to said gate of said first transistor.

23. The circuit according to claim 22, wherein a second terminal of said first resistor is coupled to said common mode output of said DC voltage source.

24. The circuit according to claim 17, wherein a first terminal of a second resistor is coupled to said gate of said second transistor.

25. The circuit according to claim 24, wherein a second terminal of said second resistor is coupled to said common mode output of said DC voltage source.

26. The circuit according to claim 17, wherein a first terminal of a first inductor is coupled to a drain of said first transistor.

27. The circuit according to claim 26, wherein a second terminal of said first inductor is coupled to said common mode output of said DC voltage source.

28. The circuit according to claim 17, wherein a first terminal of a second inductor is coupled to a drain of said second transistor.

29. The circuit according to claim 28, wherein a second terminal of said second inductor is coupled to said common mode output of said DC voltage source.

30. The circuit according to claim 17, wherein said gate of said first transistor is coupled to a first capacitor.

31. The circuit according to claim 17, wherein said gate of said second transistor is coupled to a second capacitor.

32. The circuit according to claim 17, wherein a source of said first transistor and a source of said second transistor are coupled to ground.

* * * * *